(12) United States Patent
Okuyama et al.

(10) Patent No.: US 7,923,721 B2
(45) Date of Patent: Apr. 12, 2011

(54) ELECTROMAGNETICALLY PROTECTED ORGANIC THIN FILM TRANSISTOR

(75) Inventors: Suguru Okuyama, Kyoto (JP); Yoshiaki Oku, Kyoto (JP); Noriyuki Shimoji, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 0 days.

(21) Appl. No.: 12/229,000

(22) Filed: Aug. 19, 2008

(65) Prior Publication Data

US 2009/0050882 A1 Feb. 26, 2009

(30) Foreign Application Priority Data

Aug. 20, 2007 (JP) ................. 2007-214078

(51) Int. Cl.
*H01L 51/00* (2006.01)
(52) U.S. Cl. ............. 257/40; 257/E51.001; 438/99
(58) Field of Classification Search .......... 257/40, 257/E51.001–E51.006
See application file for complete search history.

(56) References Cited

U.S. PATENT DOCUMENTS

| | | | |
|---|---|---|---|
| 2005/0255334 A1* | 11/2005 | Kang et al. | 428/690 |
| 2006/0160280 A1* | 7/2006 | Suh et al. | 438/149 |
| 2009/0072751 A1* | 3/2009 | Tischler et al. | 315/169.3 |
| 2009/0101891 A1* | 4/2009 | Moon et al. | 257/40 |

FOREIGN PATENT DOCUMENTS

| | | |
|---|---|---|
| JP | 2005-191077 | 7/2005 |
| JP | 2005-277065 | 10/2005 |

OTHER PUBLICATIONS

Sekitani, et al., "Reliability tests of organic thin-film transistors on plastic films", IEICE Technical Report OME2006-120 (Dec. 2006), pp. 65-68.

Hizu, et al., "Low voltage operation of organic CMOS inverter circuit with double-gate structure", IEICE Technical Report OME2006-56 (Jul. 2006), pp. 33-35.

* cited by examiner

*Primary Examiner* — Marcos D Pizarro
*Assistant Examiner* — Raj Gupta
(74) *Attorney, Agent, or Firm* — Hamre, Schumann, Mueller & Larson, P.C.

(57) ABSTRACT

An organic thin film transistor including: a substrate; a gate electrode placed on the substrate; a gate insulating film placed on the gate electrode; a source electrode and a drain electrode which are placed on the gate insulating film; an organic semiconductor layer placed on the gate insulating film between the source electrode and the drain electrode; a hole transport layer placed on the organic semiconductor layer; an electron transport layer placed on the hole transport layer; and a conductor layer placed on the electron transport layer; the organic thin film transistor which characteristics are stable by being protected from oxygen or moisture and being protected electromagnetically and which is suitable for integration.

8 Claims, 10 Drawing Sheets

ELECTROMAGNETICALLY PROTECTED ORGANIC THIN FILM TRANSISTOR

CROSS REFERENCE TO RELATED APPLICATION AND INCORPORATION BY REFERENCE

This application is based upon and claims the benefit of priority from prior Japanese Patent Application No. P2007-214078 filed on Aug. 20, 2007, the entire contents of which are incorporated herein by reference.

BACKGROUND OF THE INVENTION

1. Field of the Invention

The present invention relates to an organic thin film transistor. In particular, the present invention relates to the organic thin film transistor which is protected electromagnetically, is stabilized characteristics, and is suitable for integration.

2. Description of the Related Art

In a circuit element using an organic semiconductor, the circuit element, which is maintained the characteristics of the organic semiconductor stabilized for a long period of time, and whose endurance was high also for various stress, shocks, etc. from the outside, and which is excellent in reliability, is disclosed (for example, refer to Patent Document 1). The circuit element related to the Patent Document 1 is a circuit element which forms a circuit section including the organic semiconductor on a substrate, and has a sealing can which surrounds the concerned circuit section having predetermined space.

On the other hand, a field effect transistor, which has the structure which can control that characteristics change or deteriorate originated in existence of water vapor of the air, is disclosed (for example, refer to Patent Documents 2). The field effect transistor disclosed in the Patent Document 2 includes: a gate electrode formed on a base substance; a gate insulating film formed on the gate electrode; source/drain electrodes formed on the gate insulating film; and a channel forming region composed of an organic semiconductor material layer formed on the gate insulating film between the source/drain electrodes. A protective layer is formed at least on the channel forming region, and the protective layer has at least a layered structure of a layer which has hygroscopy and a layer which has moisture resistance.

As shown in FIG. 1, the structure of the conventional organic transistor includes: a gate electrode 12 placed on a substrate 10; a gate insulating film 14 placed on the gate electrode 12; an organic semiconductor layer 20 placed on the gate insulating film 14; and a source electrode 16 and a drain electrode 18 placed between the gate insulating film 14 and the organic semiconductor layer 20. In fabricating of the conventional organic transistor, as shown in FIG. 1, the gate electrode 12 is provided in the lower part, next the gate insulating film 14 is formed on the gate electrode 12, and the organic semiconductor layer 20 are formed on the gate insulating film 14. In structure of the conventional organic transistor shown in FIG. 1, it is in the state where the organic semiconductor layer 20 is exposed for the atmosphere.

As for the organic semiconductor material, since change of mobility, degradation of other various characteristics, etc. occur by oxygen and moisture in the air, etc., it is general to intercept from the atmosphere by forming a protective film on the upper part of the organic semiconductor layer 20 (for example, refer to Patent Document 2), or by using the sealing can composed of glass or metal (for example, refer to patent documents 1), as mentioned above.

Moreover, a method of providing a layered structure of an organic insulating layer and a metal layer on the upper part of the above-mentioned organic semiconductor layer 20, and using as a sealing film of the organic transistor is known (for example, refer to the Non-Patent Document 1).

Furthermore, a structure of providing an insulating layer and a metal layer on the upper part of the above-mentioned organic semiconductor layer 20, and using the metal layer as a second gate electrode is known (for example, refer to Non-Patent Document 2).

Patent document 1:
Japanese Patent Application Laying-Open Publication No. 2005-277065 (Pages 3 to 7, and FIG. 2 to FIG. 3)
Patent document 2:
Japanese Patent Application Laying-Open Publication No. 2005-191077 (Pages 10 to 11, and FIG. 3)
Non-Patent Document 1:
Technical Research Report of the Institute of Electronics, Information and Communication Engineers, OME2006-120, Vol. 106, No. 439, pp. 65-68
Non-Patent Document 2:
Technical Research Report of the Institute of Electronics, Information and Communication Engineers, OME2006-56, Vol. 106, No. 183, pp. 33-35

However, in the methods of the above-mentioned Patent Documents 1 and 2, there was a problem in a viewpoint of electromagnetic protection. That is, when organic transistor technology progresses and integration is performed, a carrier is induced by the electric field and magnetic field which are generated from the approaching element, and then malfunction of the transistor may occur.

Although the electromagnetic protection from the outside is possible in the metal sealing cans, the electromagnetic protection from an element inside of the device is impossible.

In the Non-Patent Document 1, not only the protection from oxygen and moisture in the atmosphere but also the electromagnetic protection from the outside is achieved. However, since the metal layer of the first layer opposes with the source electrode and the drain electrode on both sides of the insulating layer and the organic semiconductor layer, the parasitic capacitance exists. Since the metal layer is separated off electrically not giving potential directly, potential of the metal layer is unstably varied by an electrical change of not only the source electrode but the drain electrode. Since the metal layer adjoining through the insulating layer can act as a gate electrode, if the potential of the metal layer is unstable, it becomes a factor that the current which is not aimed generates at the time where the transistor turns OFF. That is, increase of leakage current, reduction of an ON/OFF ratio, etc. are caused.

In the Non-Patent Document 2, since the metal layer is used giving potential directly taking the electric connection as the second gate electrode, it is not the above-mentioned limitation. However, wiring and electric contact must be independently provided for the second gate electrode, in this case. Although it is expected easily that it is necessary to connect the second gate electrode with a lower layer gate electrode or other electrodes depending on a circuit to be formed, a region for electric contact formation must be ensured in that case, and integration becomes difficult.

SUMMARY OF THE INVENTION

The object of a present invention is to provide an organic thin film transistor which characteristics are stable by being protected from oxygen or moisture and being protected electromagnetically, and suitable for integration.

According to one aspect of the present invention for achieving the above-mentioned object, an organic thin film transistor including: a substrate; a gate electrode placed on the substrate; a gate insulating film placed on the gate electrode; a source electrode and a drain electrode which are placed on the gate insulating film; an organic semiconductor layer placed on the gate insulating film between the source electrode and the drain electrode; and a conductor layer placed on the organic semiconductor layer is provided.

According to the present invention, the organic thin film transistor, which characteristics are stable by being protected from oxygen or moisture and being protected electromagnetically, and which is suitable for integration, can be provided.

DETAILED DESCRIPTION OF THE EMBODIMENTS

Figure 1:
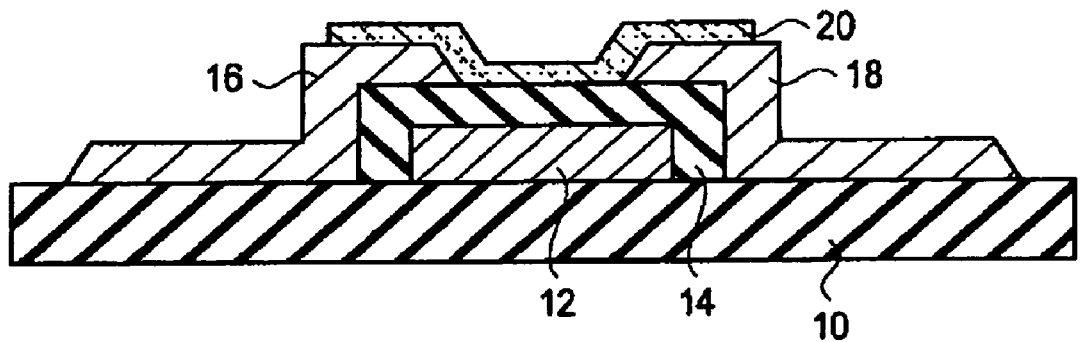
FIG. 1 is a schematic section structure chart showing a conventional organic thin film transistor.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

First Embodiment

Figure 2:
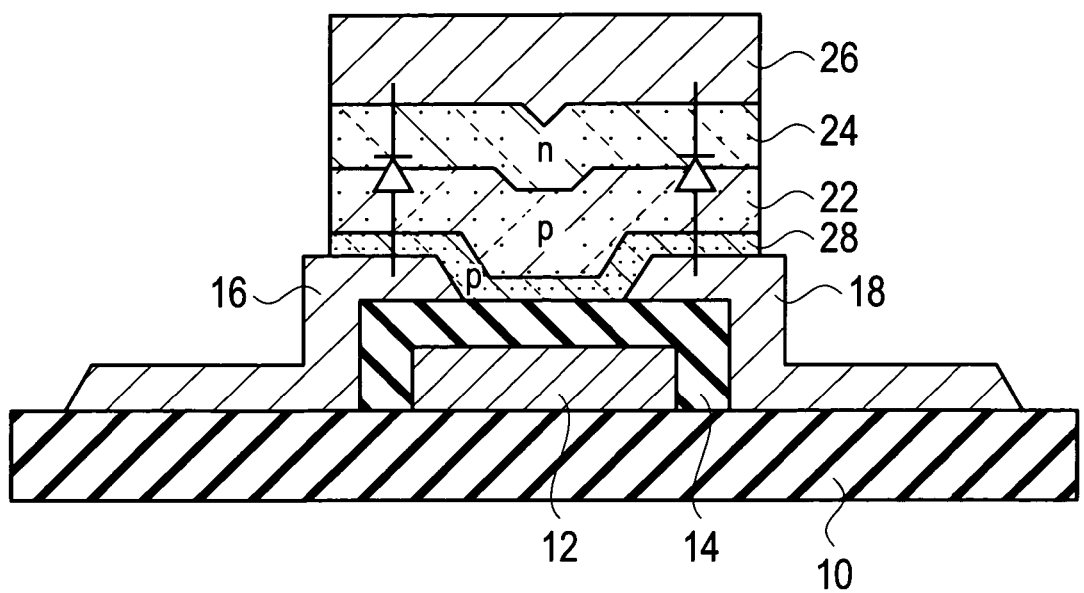
FIG. 2 is a schematic section structure chart showing an organic thin film transistor according to a first embodiment of the present invention.

A schematic section structure of an organic thin film transistor according to a first embodiment of the present invention is shown in FIG. 2.

As shown in FIG. 2, the organic thin film transistor according to the first embodiment of the present invention includes: a substrate 10; a gate electrode 12 placed on the substrate 10; a gate insulating film 14 placed on the gate electrode 12; a source electrode 16 and a drain electrode 18 which are placed on the gate insulating film 14; a p-type organic semiconductor layer 28 which is between the source electrode 16 and the drain electrode 18, and is placed on the gate insulating film 14; a hole transport layer 22 placed on the p-type organic semiconductor layer 28; a electron transport layer 24 placed on the hole transport layer 22; and a conductor layer 26 placed on the electron transport layer 24.

Moreover, the organic thin film transistor according to the first embodiment of the present invention is characterized by the absolute value of an energy level of HOMO (Highest Occupied Molecular Orbital) of the p-type organic semiconductor layer 28 being larger than the absolute value of the work function of the conductor layer 26.

At this point, the energy level of HOMO means the ground state of an organic molecule. Moreover, the energy level of LUMO (Lowest Unoccupied Molecular Orbital) mentioned later means the excitation state of an organic molecule. At this point, a LUMO level corresponds to a lowest excited singlet level ($S_1$). As for a level of hole and electron in the case where electrons and holes are further injected into an organic compound material and a radical anion ($M^-$) and a radical cation ($M^+$) are formed, the electron conduction level and the hole conduction level are located on the position of the outside of a HOMO level and a LUMO level to such an extent that exciton binding energy does not exist.

In the structure of the organic thin film transistor according to the first embodiment of the present invention, each electrode and each layer are formed by sputtering, vacuum evaporation, coating process, etc., respectively.

As shown in FIG. 2, the organic thin film transistor according to the first embodiment of the present invention provides the conductor layer 26 of a conductive material on the upper part of the organic semiconductor layer 20, and forms a p-n diode composed of the electron transport layer 24 and the hole transport layer 22 between the p-type organic semiconductor layer 28 and the conductor layer 26.

A short circuit between the source electrode 16 and the drain electrode 18 is prevented by using the above-mentioned p-n diode. That is, the short circuit between source and drain does not occur theoretically through the conductor layer 26, since the adverse current of a carrier can be prevented by the above-mentioned p-n diode.

When applying bias voltage between source and drain as the p-type transistor, since the direction of an electric field is equivalent to the reverse biased p-n junction between the conductor layer 26 and the drain electrode 18, the short circuit does not occur between the source electrode 16 and the drain electrode 18 through the conductor layer 26.

Similarly, since the direction of an electric field between the source electrode 16 and the conductor layer 26 is equivalent to the forward biased p-n junction when bias voltage is applied between source and drain, the conductor layer 26 is stabilized with the potential difference corresponding to the value of the forward voltage drop (V<) of p-n junction from a source electrode (reference potential). Moreover, the potential of the inside of the p-type organic semiconductor layer (transistor active layer) 28 is stabilized according to the electromagnetic shielding effect by the conductor layer 26.

As for the substrate 10: an inorganic material substrate, such as a glass substrate about 30 micrometers to about 1 mm thick, a stainless steel substrate, a sapphire substrate, and a silicon substrate; an organic material substrate, such as PI (polyimide), PET (polyethylene terephthalate), PEN (polyethylenenaphthalate), polycarbonate, and PES (polyether sulphone); or a plastic plate is used, for example.

Figure 11A:
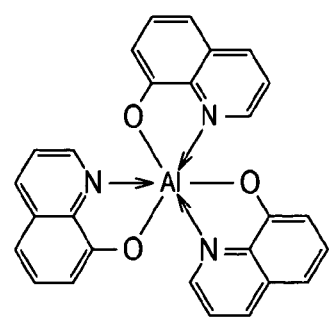
FIG. 11A shows an example of molecular structure of another electron transport material which forms the electron transport layer 24 of the organic thin film transistor according to the first to the second embodiment of the present invention, and is an example of molecular structure of Alq3.
Figure 11B:
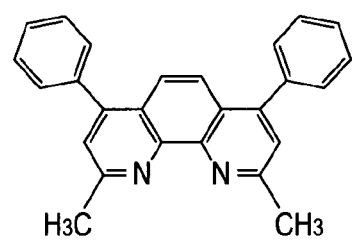
FIG. 11B shows the example of molecular structure of another electron transport material which forms the electron transport layer 24 of the organic thin film transistor according to the first to the second embodiment of the present invention, and is an example of molecular structure of BCP.
Figure 11C:
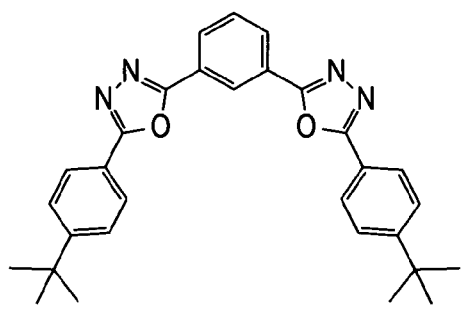
FIG. 11C shows the example of molecular structure of another electron transport material which forms the electron transport layer 24 of the organic thin film transistor according to the first to the second embodiment of the present invention, and is an example of molecular structure of an oxadiazole dimer.
Figure 11D:
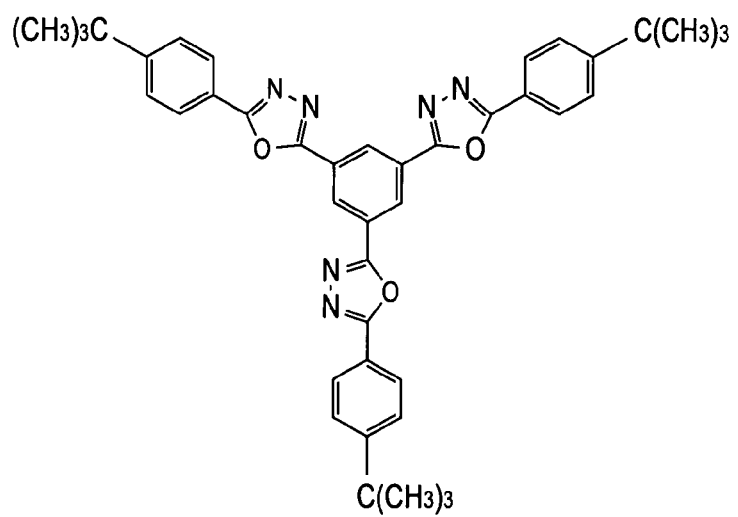
FIG. 11D shows the example of molecular structure of another electron transport material which forms the electron transport layer 24 of the organic thin film transistor according to the first to the second embodiment of the present invention, and is an example of molecular structure of starburst oxadiazole.

The gate electrode 12 is formed with: metal, such as MgAg, Al, Au, Ca, Li, Ta, Ni, and Ti; an inorganic conductive material, such as ITO and IZO; or an organic conductive material, such as PEDOT. At this point, the PEDOT is PEDOT:PSS, and is a material called poly-(3,4-ethylenedioxy-thiophene): poly-styrene sulfonate, and has molecular structure as shown in FIG. 11A mentioned later.

The gate insulating film 14 is formed with: an inorganic insulator material, such as $SiO_2$, $Si_3N_4$, $Al_2O_3$, and $Ta_2O_5$; or an organic insulator material, such as PI (polyimide), PVP (polyvinyl phenol), and PVA (polyvinyl alcohol); for example.

For example, metal, such as Ag, Al, Cr, Au, Ni, and Ti, metal with a high work function, such as Pt and Ta, an inorganic conductive material, such as ITO and IZO, and an organic conductive material, such as PEDOT, are used for the source electrode 16 and the drain electrode 18, and a material suitable for carrier injection into the p-type organic semiconductor layer (transistor active layer) 28 is used for the source electrode 16 and the drain electrode 18.

The p-type organic semiconductor layer (transistor active layer) 28 is formed with organic semiconductor materials, such as pentacene, a P3HT (poly 3-hexyl thiophene), and a CuPc (copper phthalocyanine), for example.

Figure 4A:
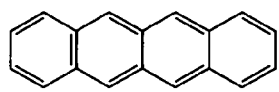
FIG. 4A shows an example of molecular structure of a p-type organic semiconductor material applicable to a p-type organic semiconductor layer (transistor active layer) 28 of an organic thin film transistor according to the first embodiment of the present invention, and is an example of molecular structure of tetracene as an Assen related material.
Figure 4B:
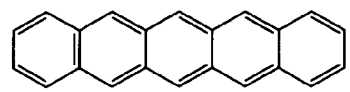
FIG. 4B shows the example of molecular structure of the p-type organic semiconductor material applicable to the p-type organic semiconductor layer (transistor active layer) 28 of the organic thin film transistor according to the first embodiment of the present invention, and is an example of molecular structure of pentacene as an Assen related material.
Figure 4C:
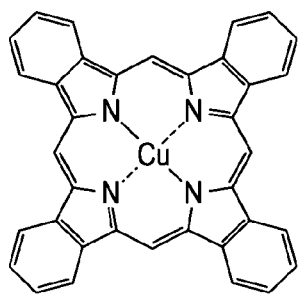
FIG. 4C shows the example of molecular structure of the p-type organic semiconductor material applicable to the p-type organic semiconductor layer (transistor active layer) 28 of the organic thin film transistor according to the first embodiment of the present invention, and is an example of molecular structure of copper phthalocyanine (CuPc) as a phthalocyanine related material.
Figure 6A:
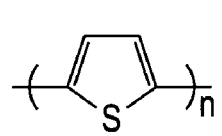
FIG. 6A shows an example of molecular structure of a polymers related semiconductor material applicable to the p-type organic semiconductor layer (transistor active layer) 28 of the organic thin film transistor according to the first embodiment of the present invention, and is an example of molecular structure of the PT (polythiophene).
Figure 6B:
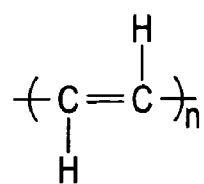
FIG. 6B shows the example of molecular structure of the polymers related semiconductor material applicable to the p-type organic semiconductor layer (transistor active layer) 28 of the organic thin film transistor according to the first embodiment of the present invention, and is an example of molecular structure of PA (polyacetylene).
Figure 6C:
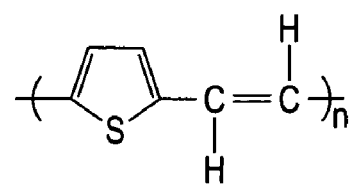
FIG. 6C shows the example of molecular structure of the polymers related semiconductor material applicable to the p-type organic semiconductor layer (transistor active layer) 28 of the organic thin film transistor according to the first embodiment of the present invention, and is an example of molecular structure of PTV (polythienylenevinylene).
Figure 6D:
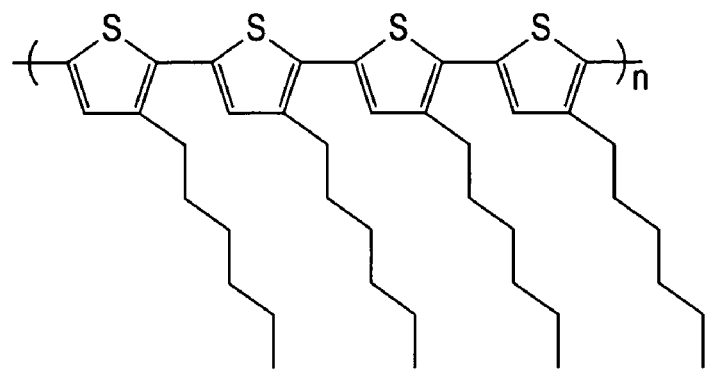
FIG. 6D shows the example of molecular structure of the polymers related semiconductor material applicable to the p-type organic semiconductor layer (transistor active layer) 28 of the organic thin film transistor according to the first embodiment of the present invention, and is an example of molecular structure of P3HT (Poly-3-hexylthiophene).
Figure 6E:
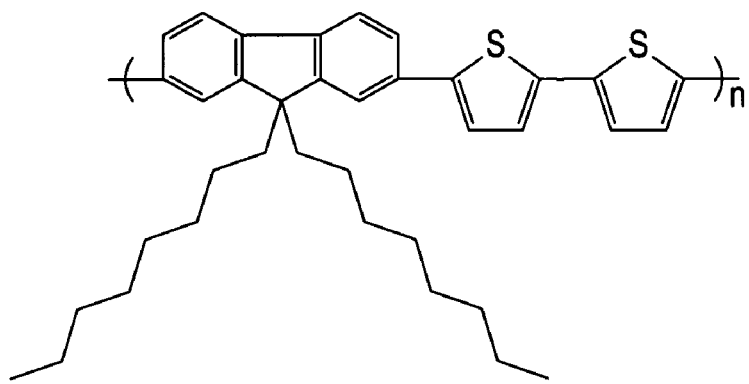
FIG. 6E shows the example of molecular structure of the polymers related semiconductor material applicable to the p-type organic semiconductor layer (transistor active layer) 28 of the organic thin film transistor according to the first embodiment of the present invention, and is an example of molecular structure of 9,9-dioctylfluorene-bithiophene copolymer (F8T2).

The pentacene has molecular structure as shown in FIG. 4B mentioned later. The P3HT (poly 3-hexyl thiophene) has molecular structure as shown in FIG. 6D mentioned later. The CuPc (copper phthalocyanine) has molecular structure as shown in FIG. 4C mentioned later.

Or for example, replacing formation of the p-type organic semiconductor layer (transistor active layer) 28 can also be performed with inorganic semiconductor materials, such as a-Si and polysilicon, etc.

Figure 4D:
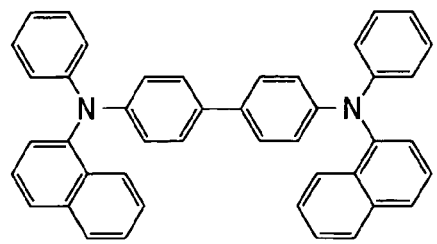
FIG. 4D shows the example of molecular structure of the p-type organic semiconductor material applicable to the p-type organic semiconductor layer (transistor active layer) 28 of the organic thin film transistor according to the first embodiment of the present invention, and is an example of molecular structure of α-NPD.
Figure 4E:
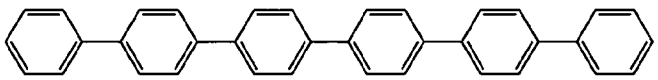
FIG. 4E shows the example of molecular structure of the p-type organic semiconductor material applicable to the p-type organic semiconductor layer (transistor active layer) 28 of the organic thin film transistor according to the first embodiment of the present invention, and is an example of molecular structure of P-6P.
Figure 4F:
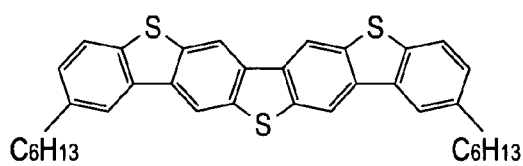
FIG. 4F shows the example of molecular structure of the p-type organic semiconductor material applicable to the p-type organic semiconductor layer (transistor active layer) 28 of the organic thin film transistor according to the first embodiment of the present invention, and is an example of molecular structure of DBTBT.
Figure 4G:
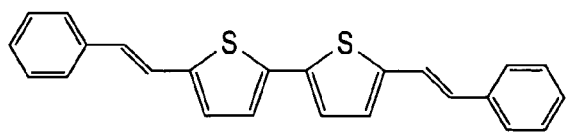
FIG. 4G shows the example of molecular structure of the p-type organic semiconductor material applicable to the p-type organic semiconductor layer (transistor active layer) 28 of the organic thin film transistor according to the first embodiment of the present invention, and is an example of molecular structure of BV2TVB.
Figure 4H:
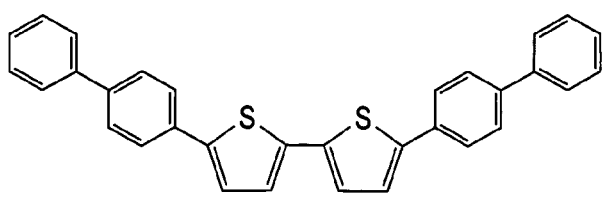
FIG. 4H shows the example of molecular structure of the p-type organic semiconductor material applicable to the p-type organic semiconductor layer (transistor active layer) 28 of the organic thin film transistor according to the first embodiment of the present invention, and is an example of molecular structure of BP2T.
Figure 4I:
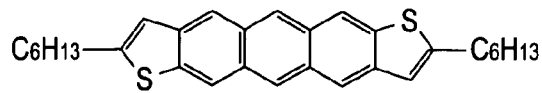
FIG. 4I shows the example of molecular structure of the p-type organic semiconductor material applicable to the p-type organic semiconductor layer (transistor active layer) 28 of the organic thin film transistor according to the first embodiment of the present invention, and is an example of molecular structure of DHADT.
Figure 5A:
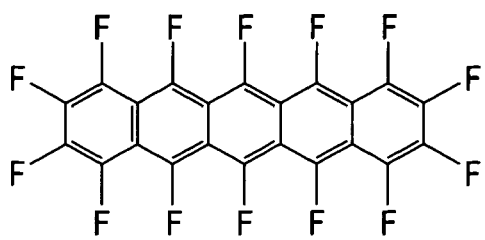
FIG. 5A shows an example of molecular structure of an n-type organic semiconductor material applicable to an n-type organic semiconductor layer (transistor active layer) 30 of the organic thin film transistor according to the second embodiment of the present invention, and is an example of molecular structure of tetradecafluoropentacene.
Figure 5B:
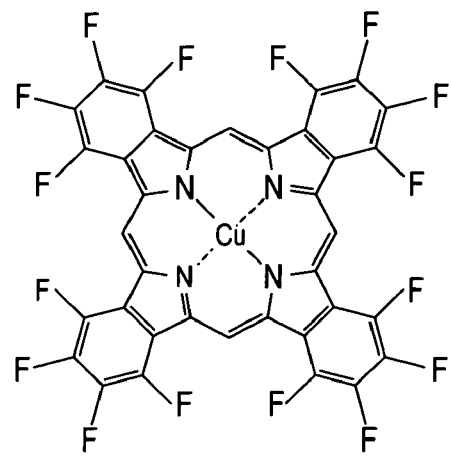
FIG. 5B shows the example of molecular structure of the n-type organic semiconductor material applicable to the n-type organic semiconductor layer (transistor active layer) 30 of the organic thin film transistor according to the second embodiment of the present invention, and is an example of molecular structure of copper hexadecafluorophthalocyanine ($F_{16}$CuPc).
Figure 5C:
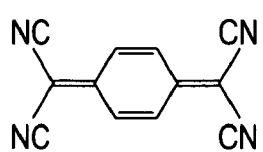
FIG. 5C shows the example of molecular structure of the n-type organic semiconductor material applicable to the n-type organic semiconductor layer (transistor active layer) 30 of the organic thin film transistor according to the second embodiment of the present invention, and is an example of molecular structure of TCNQ.
Figure 5D:
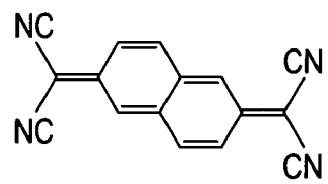
FIG. 5D shows the example of molecular structure of the n-type organic semiconductor material applicable to the n-type organic semiconductor layer (transistor active layer) 30 of the organic thin film transistor according to the second embodiment of the present invention, and is an example of molecular structure of TCNNQ.
Figure 5E:
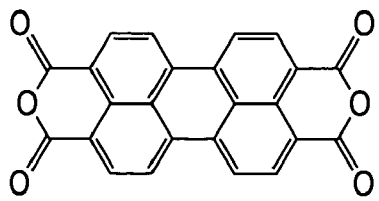
FIG. 5E shows the example of molecular structure of the n-type organic semiconductor material applicable to the n-type organic semiconductor layer (transistor active layer) 30 of the organic thin film transistor according to the second embodiment of the present invention, and is an example of molecular structure of PTCDA.
Figure 5F:
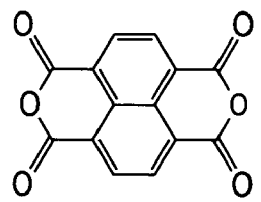
FIG. 5F shows the example of molecular structure of the n-type organic semiconductor material applicable to the n-type organic semiconductor layer (transistor active layer) 30 of the organic thin film transistor according to the second embodiment of the present invention, and is an example of molecular structure of NTCDA.
Figure 5G:
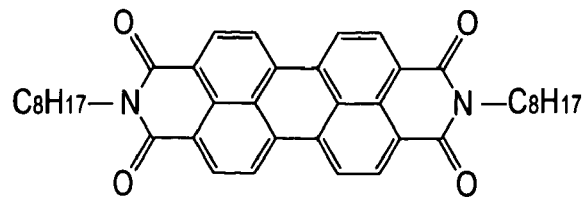
FIG. 5G shows the example of molecular structure of the n-type organic semiconductor material applicable to the n-type organic semiconductor layer (transistor active layer) 30 of the organic thin film transistor according to the second embodiment of the present invention, and is an example of molecular structure of PTCDI-C8.

The hole transport layer 22 is α-NPD, which is called 4,4-bis [N-(1-naphtyl-1-) N-phenyl-amino]-biphenyl, and has molecular structure as shown in FIG. 4D mentioned later.

The electron transport layer 24 can be formed, for example by Alq3 etc. At this point, Alq3 is a material called aluminum 8-hydroxyquinolinate or tri 8-quinolinolato aluminum, and has molecular structure as shown in FIG. 11A mentioned later.

The conductor layer 26 can be formed, for example with: a metallic material, such as MgAg, Al, Ca, Li, Cs, Ni, and Ti; an inorganic conductive material, such as ITO and IZO; and an organic conductive material, such as PEDOT.

In the structure of the organic thin film transistor according to the first embodiment of the present invention, since the conductor layer 26 covers the upper part of the p-type organic semiconductor layer (transistor active layer) 28, the conductor layer 26 can act as an electromagnetic noise shield. Moreover, the conductor layer 26 of the upside acts also as a protective film from oxygen or moisture. Moreover, in the structure of the organic thin film transistor according to the first embodiment of the present invention, the electrical potential of the p-type organic semiconductor layer (transistor active layer) 28 is electrically stabilized by the conductor layer 26.

Moreover, between the source electrode 16 and the conductor layer 26, since electrical connection is achieved without adding electrical contact, wiring, etc., it is suitable for integration.

(P-Type Organic Semiconductor Material)

FIG. 4 shows an example of molecular structure of a p-type organic semiconductor material applicable to the p-type organic semiconductor layer (transistor active layer) 28 of the organic thin film transistor according to the first embodiment of the present invention. FIG. 4A shows an example of molecular structure of the tetracene as an Assen related material, FIG. 4B shows an example of molecular structure of pentacene as an Assen related material, FIG. 4C shows an example of molecular structure of the CuPc (copper phthalocyanine) as a phthalocyanine related material, FIG. 4D shows an example of molecular structure of α-NPD as a phthalocyanine related material, FIG. 4E shows an example of molecular structure of P-6P, FIG. 4F shows an example of molecular structure of DBTBT, FIG. 4G shows an example of molecular structure of BV2TVB, FIG. 4H shows an example of molecular structure of BP2T, and FIG. 4I shows an example of molecular structure of DHADT, respectively.

(Polymers Related Semiconductor Material)

FIG. 6 shows an example of molecular structure of a polymers related semiconductor material applicable to the p-type organic semiconductor layer (transistor active layer) 28 of the organic thin film transistor according to the first embodiment of the present invention. FIG. 6A shows the example of molecular structure of a PT (Polythiophene), FIG. 6B shows the example of molecular structure of a PA (Polyacetylene), FIG. 6C shows the example of molecular structure of a PTV (Polythienylenevinylene), FIG. 6D shows the example of molecular structure of a P3HT (Polly-3-hexyl thiophene), and FIG. 6E shows the example of molecular structure of a 9,9-dioctyl fluorene bithiophene copolymer (F8T2), respectively.

(Electrode Material)

Figure 7A:
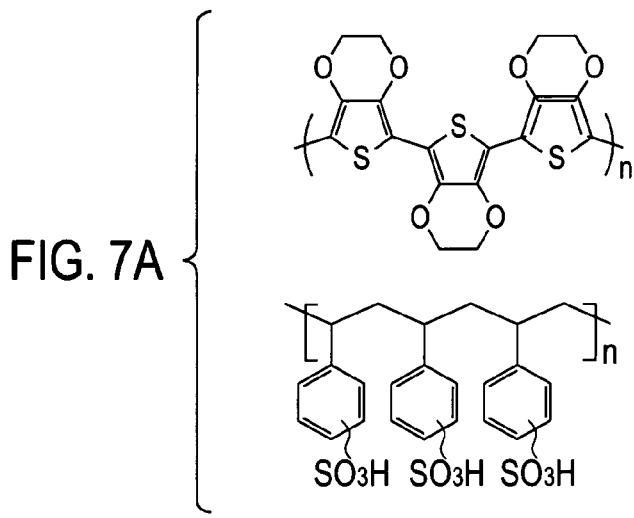
FIG. 7A shows an example of molecular structure of an electrode material applicable to a source electrode 16, a drain electrode 18, and a gate electrode 12 of the organic thin film transistor according to the first embodiment of the present invention, and is an example of molecular structure of PEDOT (Poly 3,4-ethylene dioxythiophene): PSS (polystyrene sulfonate).
Figure 7B:
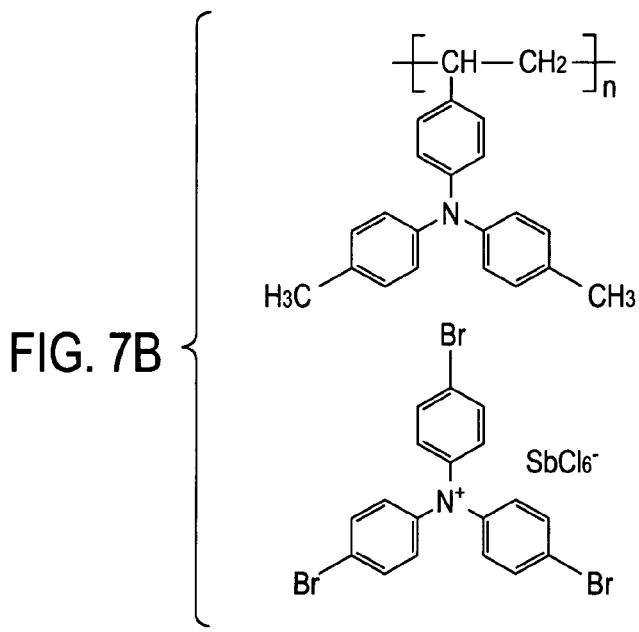
FIG. 7B shows the example of molecular structure of the electrode material applicable to the source electrode 16, the drain electrode 18, and the gate electrode 12 of the organic thin film transistor according to the first embodiment of the present invention, and is an example of molecular structure of PVPTA2:TBPAH.
Figure 7C:
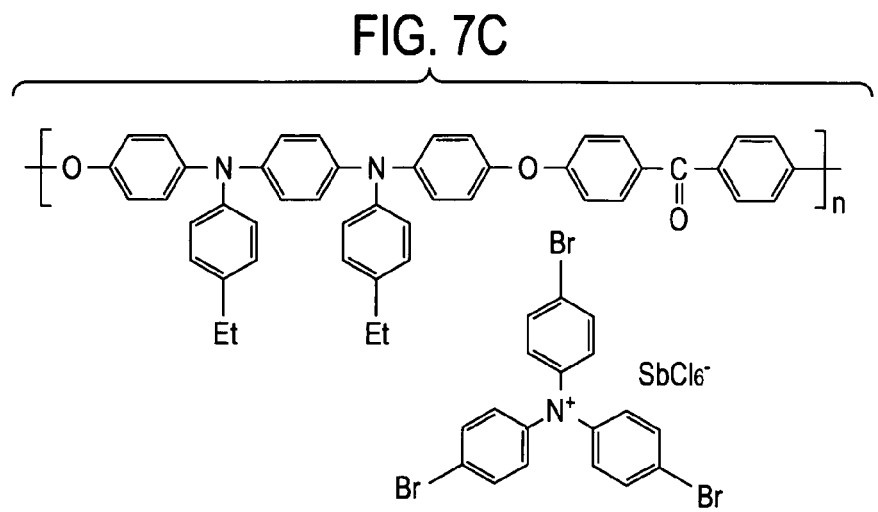
FIG. 7C shows the example of molecular structure of the electrode material applicable to the source electrode 16, the drain electrode 18, and the gate electrode 12 of the organic thin film transistor according to the first embodiment of the present invention, and is an example of molecular structure of Et-PTPDEK:TBPAH.
Figure 8A:
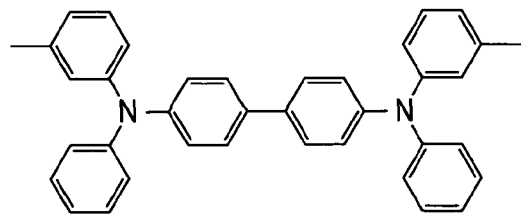
FIG. 8A shows an example of molecular structure of a hole transport material which forms a hole transport layer 22 of the organic thin film transistor according to the first to the second embodiments of the present invention, and is an example of molecular structure of TPD.
Figure 8B:
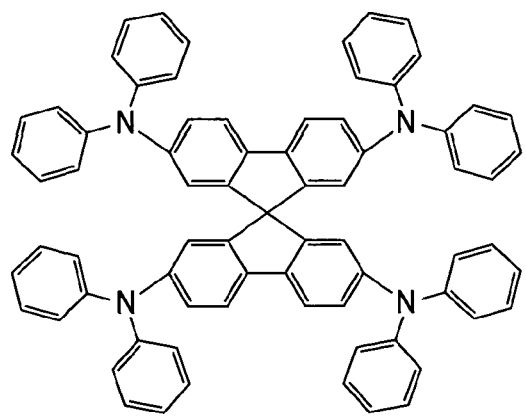
FIG. 8B shows the example of molecular structure of the hole transport material which forms the hole transport layer 22 of the organic thin film transistor according to the first to the second embodiments of the present invention, and is an example of molecular structure of spiro-TAD.
Figure 8C:
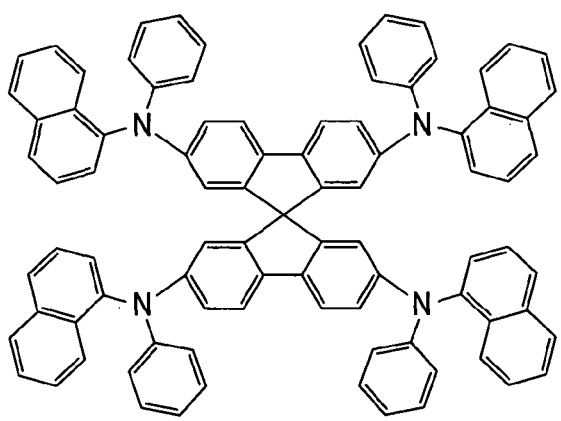
FIG. 8C shows the example of molecular structure of the hole transport material which forms the hole transport layer 22 of the organic thin film transistor according to the first to the second embodiments of the present invention, and is an example of molecular structure of spiro-NPD.
Figure 8D:
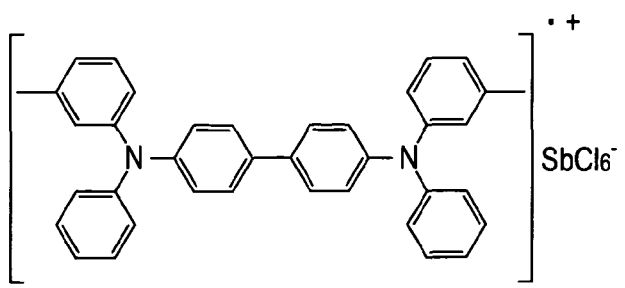
FIG. 8D shows the example of molecular structure of the hole transport material which forms the hole transport layer 22 of the organic thin film transistor according to the first to the second embodiments of the present invention, and is an example of molecular structure of oxidized-TPD.

FIG. 7 shows an example of molecular structure of an organic electrode material applicable to the source electrode 16, the drain electrode 18, or the gate electrode 12 of the organic thin film transistor according to the first embodiment of the present invention. FIG. 7A shows an example of molecular structure of PEDOT (poly 3,4-ethylenedioxythiophene):PSS (poly-styrene sulfonate), FIG. 7B shows an example of molecular structure of PVPTA2:TBPAH, and FIG. 7C shows an example of molecular structure of Et-PTPDEK:TBPAH, respectively.

(Hole Transport Material for Forming Hole Transport Layer)

FIG. 8 shows an example of molecular structure of a hole transport material which forms a hole transport layer 22 of the organic thin film transistor according to the first to the second embodiments of the present invention. FIG. 8A shows an example of molecular structure of TPD, FIG. 8B shows an example of molecular structure of spiro-TAD, FIG. 8C shows an example of molecular structure of spiro-NPD, and FIG. 8D shows an example of molecular structure of oxidized-TPD, respectively.

Figure 9A:
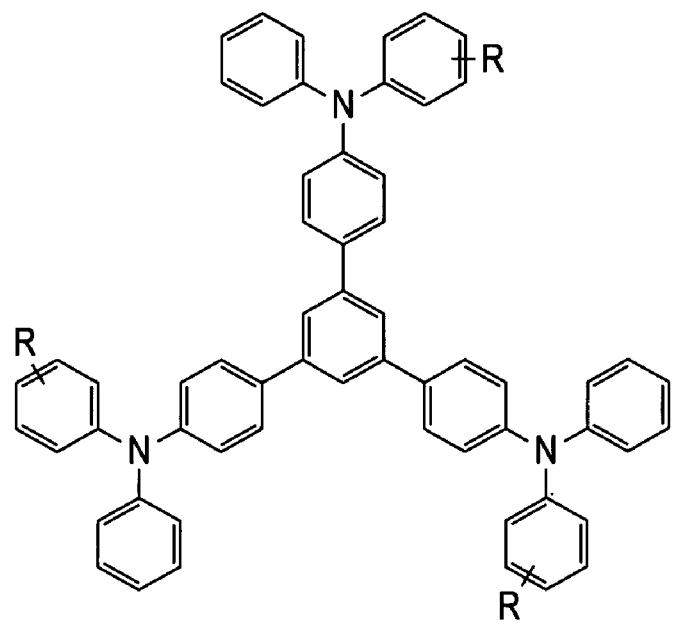
FIG. 9A shows an example of molecular structure of another hole transport material which forms the hole transport layer 22 of the organic thin film transistor related to the first to the second embodiment of the present invention, and is an example of molecular structure of TDAPB.
Figure 9B:
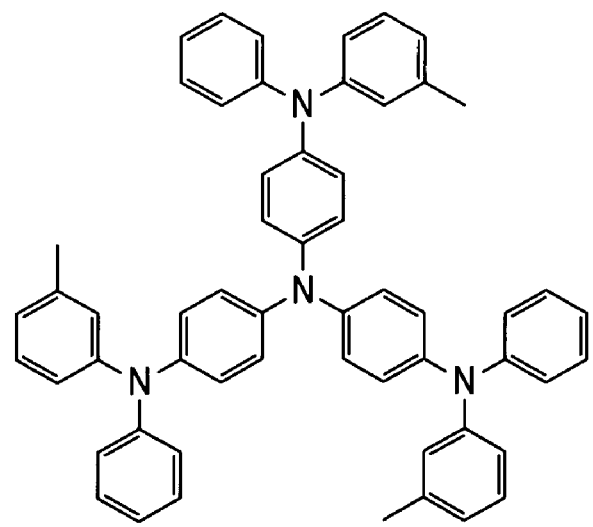
FIG. 9B shows the example of molecular structure of another hole transport material which forms the hole transport layer 22 of the organic thin film transistor related to the first to the second embodiment of the present invention, and is an example of molecular structure of MTDATA.
Figure 10A:
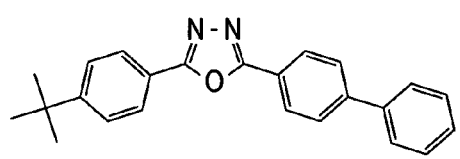
FIG. 10A shows an example of molecular structure of an electron transport material which forms an electron transport layer 24 of the organic thin film transistor according to the first to the second embodiment of the present invention, and is an example of molecular structure of t-butyl-PBD.
Figure 10D:
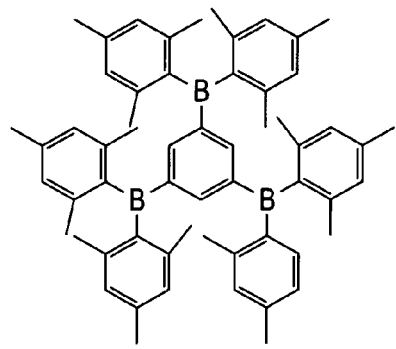
FIG. 10D shows the example of molecular structure of the electron transport material which forms the electron transport layer 24 of the organic thin film transistor according to the first to the second embodiment of the present invention, and is an example of molecular structure of a boron replacement type triaryl related compound.
Figure 10B:
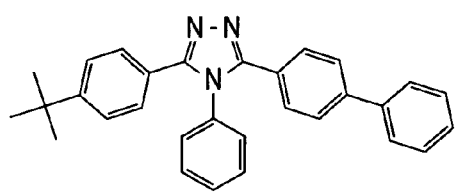
FIG. 10B shows the example of molecular structure of the electron transport material which forms the electron transport layer 24 of the organic thin film transistor according to the first to the second embodiment of the present invention, and is an example of molecular structure of TAZ.
Figure 10E:
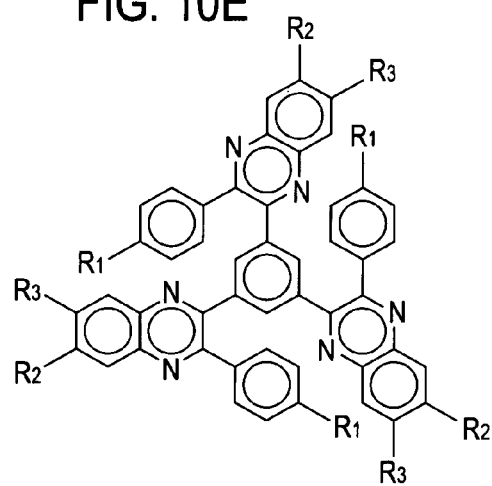
FIG. 10E shows the example of molecular structure of the electron transport material which forms the electron transport layer 24 of the organic thin film transistor according to the first to the second embodiment of the present invention, and is an example of molecular structure of a phenylquinoxaline derivative.
Figure 10C:
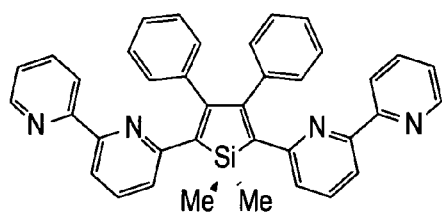
FIG. 10C shows the example of molecular structure of the electron transport material which forms the electron transport layer 24 of the organic thin film transistor according to the first to the second embodiment of the present invention, and is an example of molecular structure of a silole derivative.

Moreover, FIG. 9 shows an example of molecular structure of another hole transport material for forming the hole transport layer 22 of the organic thin film transistor according to the first embodiment of the present invention, and FIG. 9A shows an example of molecular structure of TDAPB, and FIG. 9B shows an example of molecular structure of MTDATA, respectively.

(Electron Transport Material for Forming Electron Transport Layer)

FIG. 10 shows an example of molecular structure of an electron transport material for forming the electron transport layer 24 of the organic thin film transistor according to the first embodiment of the present invention. FIG. 10A shows an example of molecular structure of an oxadiazole derivative (t-butyl-PBD), FIG. 10B shows an example of molecular structure of a triazole derivative (TAZ), FIG. 10C shows an example of molecular structure of a silole derivative, FIG. 10D shows an example of molecular structure of a boron replacement type triaryl related compound, and FIG. 10E shows an example of molecular structure of a phenylquinoxaline derivative, respectively.

Moreover, FIG. 11 shows an example of molecular structure of another electron transport material for forming the electron transport layer 24 of the organic thin film transistor according to the first embodiment of the present invention. FIG. 11A shows an example of molecular structure of Alq3, FIG. 11B shows an example of molecular structure of a phenanthroline derivative (BCP:Bathocuproine), FIG. 11C shows an example of molecular structure of an oxadiazole dimer, and FIG. 11D shows an example of molecular structure of starburst oxadiazole, respectively.

According to the first embodiment of the present invention, the organic thin film transistor, which characteristics are stable by being protected from oxygen or moisture and being protected electromagnetically, and which is suitable for integration, can be provided.

Second Embodiment

Figure 3:
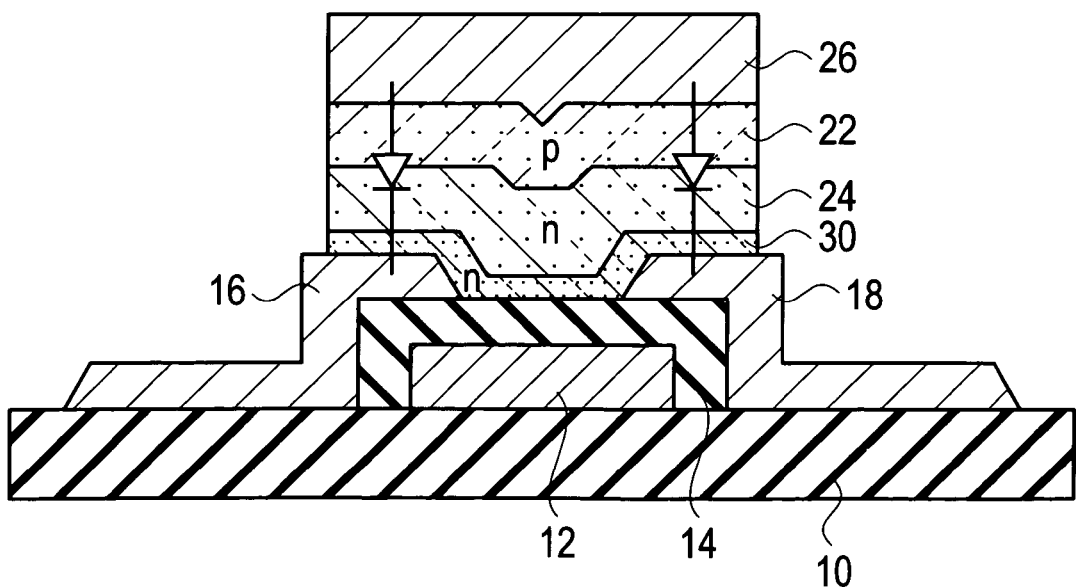
FIG. 3 is a schematic section structure chart showing an organic thin film transistor according to a second embodiment of the present invention.

A schematic section structure of an organic thin film transistor according to a second embodiment of the present invention is shown in FIG. 3.

As shown in FIG. 3, the organic thin film transistor according to the second embodiment of the present invention includes: a substrate 10; a gate electrode 12 placed on the substrate 10; a gate insulating film 14 placed on the gate electrode 12; a source electrode 16 and a drain electrode 18 which are placed on the gate insulating film 14; an n-type organic semiconductor layer 30 placed on the gate insulating film 14 between the source electrode 16 and the drain electrode 18; an electron transport layer 24 placed on the n-type organic semiconductor layer 30; a hole transport layer 22 placed on the electron transport layer 24; and a conductor layer 26 placed on the hole transport layer 22.

Moreover, the organic thin film transistor according to the second embodiment of the present invention is characterized by an absolute value of energy level of LUMO of the n-type organic semiconductor layer 30 being smaller than an absolute value of a work function of the conductor layer 26. At this point, the energy level of LUMO means an excitation state of an organic molecule as above-mentioned. At this point, the LUMO level corresponds to a lowest excited singlet level ($S_1$) as above-mentioned. As for a level of hole and electron in the case where electrons and holes are further injected into an organic compound material and a radical anion (M⁻) and a radical cation (M⁺) are formed, the electron conduction level and the hole conduction level are located on the position of the outside of a HOMO level and a LUMO level to such an extent that exciton binding energy does not exist.

The conductor layer 26 includes Al or Pt, Au, Ta, etc., for example.

The conductor layer 26 may be formed by organic conductive materials, such as PEDOT.

Or the conductor layer 26 may be formed by an ITO inorganic conductive material.

In the structure of the organic thin film transistor according to the second embodiment of the present invention, each electrode and each layer are formed by sputtering, vacuum evaporation, coating process, etc., respectively.

As shown in FIG. 3, the organic thin film transistor according to the second embodiment of the present invention includes the conductor layer 26 of a conductive material on the upper part of the n-type organic semiconductor layer 30, and p-n diode composed of the electron transport layer 24 and the hole transport layer 22 is formed between the n-type organic semiconductor layer 30 and the conductor layer 26.

A short circuit between the source electrode 16 and the drain electrode 18 is prevented by using the above-mentioned p-n diode. That is, the short circuit between source and drain does not occur theoretically through the conductor layer 26, since the adverse current of a carrier can be prevented by the above-mentioned p-n diode.

As for any one of p-n junctions between the conductor layer 26 and the drain electrode 18 or between the conductor layer 26 and the source electrode 16, since the direction of an electric field is equivalent to reverse biased p-n junction at the time of applying bias voltage between the source and the drain as a n-type transistor, the short circuit does not occur between the source electrode 16 and the drain electrode 18 through the conductor layer 26.

Moreover, the potential inside the n-type organic semiconductor layer (transistor active layer) 30 is stabilized according to the electromagnetic shielding effect of the conductor layer 26.

Since a formation material of the substrate 10, the gate electrode 12, the gate insulating film 14, the source electrode 16 and the drain electrode 18, the electron transport layer 24, the hole transport layer 22, and the conductor layer 26 is the same as that of the first embodiment respectively, the description is omitted.

(N-Type Organic Semiconductor Material)

FIG. 5 shows an example of molecular structure of a n-type organic semiconductor material applicable to the n-type organic semiconductor layer (transistor active layer) 30 of the organic thin film transistor according to the second embodiment of the present invention. FIG. 5A shows an example of molecular structure of a tetradecafluoropentacene, FIG. 5B shows an example of molecular structure of a copper hexadecafluorophthalocyanine ($F_{16}CuPc$), FIG. 5C shows an example of molecular structure of TCNQ, FIG. 5D shows an example of molecular structure of TCNNQ, FIG. 5E shows an example of molecular structure of PTCDA, FIG. 5F shows an example of molecular structure of NTCDA, and FIG. 5G shows an example of molecular structure of PTCDI-C8, respectively.

In the structure of the organic thin film transistor according to the second embodiment of the present invention, since the conductor layer 26 covers the upper part of the n-type organic semiconductor layer (transistor active layer) 30, the conductor layer 26 can act as an electromagnetic noise shield. Moreover, the upside of the conductor layer 26 acts also as a protective film from oxygen or moisture. In the structure of the organic thin film transistor according to the second embodiment of the present invention, the electrical potential of the n-type organic semiconductor layer (transistor active layer) 30 is electrically stabilized by the conductor layer 26.

According to the second embodiment of the present invention, the organic thin film transistor, which characteristics are stable by being protected from oxygen or moisture and being protected electromagnetically, and which is suitable for integration, can be provided.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art.

Accordingly, the technical scope of the present invention is defined by the claims that appear appropriate from the above explanation, as well as by the spirit of the invention. Various modifications will become possible for those skilled in the art after receiving the teachings of the present disclosure without departing from the scope thereof.

INDUSTRIAL APPLICABILITY

The organic thin film transistor of the present invention is applicable in wide fields, such as an organic electroluminescence display for achieving a flexible display, a lighting apparatus, an organic laser, a solar battery, a gas sensor, and biosensors, such as a taste sensor and a smell sensor.

What is claimed is:

1. An organic thin film transistor comprising:
a substrate;
a gate electrode placed on the substrate;
a gate insulating film placed on the gate electrode and the substrate;
a source electrode and a drain electrode which are placed on the gate insulating film and the substrate;
a first organic semiconductor layer of a first conductivity type placed on the gate insulating film between and directly on the source electrode and the drain electrode;
a second organic semiconductor layer of a first conductivity type placed on the first organic semiconductor layer;
a third organic semiconductor layer of a second conductivity type placed on the second organic semiconductor layer; and
an electrically floating conductor layer placed directly on the third organic semiconductor layer,
wherein the third organic semiconductor layer and the second organic semiconductor layer define a p-n diode sandwiched by the first organic semiconductor layer and the conductor layer, and
the p-n diode being configured to prevent a short circuit through the conductor layer between the source electrode and the drain electrode.

2. The organic thin film transistor according to claim 1, wherein
the first organic semiconductor layer is a p-type, and an absolute value of energy level of HOMO of the p-type organic semiconductor layer is larger than an absolute value of a work function of the conductor layer.

3. The organic thin film transistor according to claim 1, wherein the first organic semiconductor layer is an n-type, and an absolute value of energy level of LUMO of the n-type organic semiconductor layer is smaller than an absolute value of a work function of the conductor layer.

4. The organic thin film transistor according to claim 1, wherein the second and the third organic layers are charge transport layers.

5. The organic thin film transistor according to claim 1, wherein the second organic layer is a hole transport layer and the third organic layer is an electron transport layer.

6. The organic thin film transistor according to claim 5, wherein
the first organic semiconductor layer is a p-type organic semiconductor layer, the hole transport layer is placed on the p-type organic semiconductor layer, the electron transport layer is placed on the hole transport layer, and the conductor layer is placed on the electron transport layer.

7. The organic thin film transistor according to claim 1, wherein the second organic layer is an electron transport layer and the third organic layer is a hole transport layer.

8. The organic thin film transistor according to claim 7, wherein
the first organic semiconductor layer is an n-type organic semiconductor layer, the electron transport layer is placed on the n-type organic semiconductor layer, the hole transport layer is placed on the electron transport layer, and the conductor layer is placed on the hole transport layer.

* * * * *